(12) United States Patent
Seki

(10) Patent No.: US 11,812,565 B2
(45) Date of Patent: Nov. 7, 2023

(54) DISPLAY APPARATUS

(71) Applicant: JOLED INC., Tokyo (JP)

(72) Inventor: Takahiro Seki, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 17/647,148

(22) Filed: Jan. 5, 2022

(65) Prior Publication Data

US 2022/0225519 A1 Jul. 14, 2022

(30) Foreign Application Priority Data

Jan. 12, 2021 (JP) ................. 2021-002600

(51) Int. Cl.
*H05K 5/02* (2006.01)
*H05K 5/00* (2006.01)
*G06F 1/16* (2006.01)

(52) U.S. Cl.
CPC ......... *H05K 5/0217* (2013.01); *G06F 1/1652* (2013.01); *H05K 5/0017* (2013.01)

(58) Field of Classification Search
CPC ............................ G06F 1/1652; H05K 5/0217
See application file for complete search history.

(56) References Cited

U.S. PATENT DOCUMENTS

| | | | | |
|---|---|---|---|---|
| 11,089,700 B2* | 8/2021 | Kang | ................. | G09F 9/301 |
| 11,670,199 B2* | 6/2023 | Kang | ................. | G06F 1/1656 |
| | | | | 361/679.01 |
| 2018/0097197 A1 | 4/2018 | Han et al. | | |
| 2019/0098774 A1 | 3/2019 | Park et al. | | |
| 2019/0207141 A1 | 7/2019 | Kim et al. | | |
| 2020/0004296 A1* | 1/2020 | Lee | ................. | G06F 1/1641 |
| 2020/0052239 A1 | 2/2020 | Kim et al. | | |
| 2020/0084897 A1 | 3/2020 | Shin et al. | | |
| 2020/0093011 A1* | 3/2020 | Lee | ................. | H05K 5/0217 |
| 2020/0135065 A1* | 4/2020 | Song | ................. | H05K 1/028 |
| 2020/0170114 A1* | 5/2020 | Choi | ................. | H05K 5/0217 |
| 2020/0203642 A1 | 6/2020 | Kim et al. | | |
| 2020/0205301 A1* | 6/2020 | Song | ................. | H05K 5/0017 |
| 2020/0314552 A1* | 10/2020 | Kim | ................. | H04R 17/00 |
| 2021/0007230 A1* | 1/2021 | Kang | ................. | H05K 5/03 |
| 2021/0074189 A1* | 3/2021 | Kwon | ................. | G06F 1/1652 |
| 2021/0183275 A1* | 6/2021 | Han | ................. | G09F 9/301 |
| 2021/0360800 A1* | 11/2021 | Horiuchi | ................. | G06F 1/1652 |

(Continued)

FOREIGN PATENT DOCUMENTS

JP 6698920 B2 5/2020

*Primary Examiner* — Sagar Shrestha
(74) *Attorney, Agent, or Firm* — CHIP LAW GROUP

(57) ABSTRACT

A display apparatus includes a flexible display panel, a drive board that drives the display panel, a flexible board that connects the display panel and the drive board, a core to which the drive board is fixed, rolls up the display panel and the flexible board, and a connection member including a plate-shaped member that is layered on the display panel, connects the display panel and the core, and is rolled up around the core along with the display panel and the flexible board. The plate-shaped member includes a first part overlapping the display panel and curved when the display panel is rolled up around the core and a second part overlapping the flexible board and curved when the flexible board is rolled up around the core. In a roll-up direction, an elongation rate of the second part is smaller than that of the first part.

7 Claims, 13 Drawing Sheets

(56) References Cited

U.S. PATENT DOCUMENTS

| | | | |
|---|---|---|---|
| 2022/0029124 A1* | 1/2022 | Kang | G06F 1/1652 |
| 2022/0068170 A1* | 3/2022 | Han | G06F 1/1624 |
| 2022/0076596 A1* | 3/2022 | Song | G06F 1/1656 |
| 2022/0130288 A1* | 4/2022 | Park | G06F 1/1652 |
| 2022/0141978 A1* | 5/2022 | Yoon | G06F 1/1601 |
| | | | 361/807 |
| 2022/0183174 A1* | 6/2022 | Bae | G06F 1/1641 |
| 2022/0189347 A1* | 6/2022 | Oh | G06F 1/1652 |

\* cited by examiner

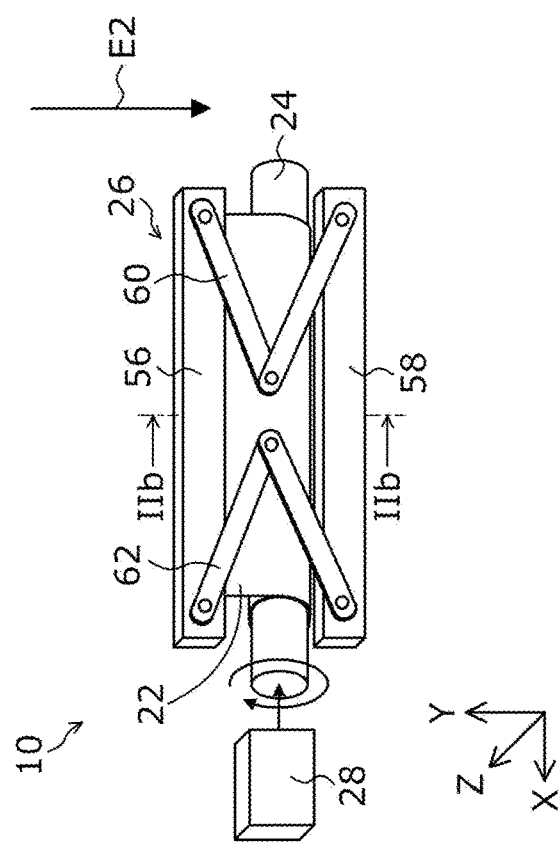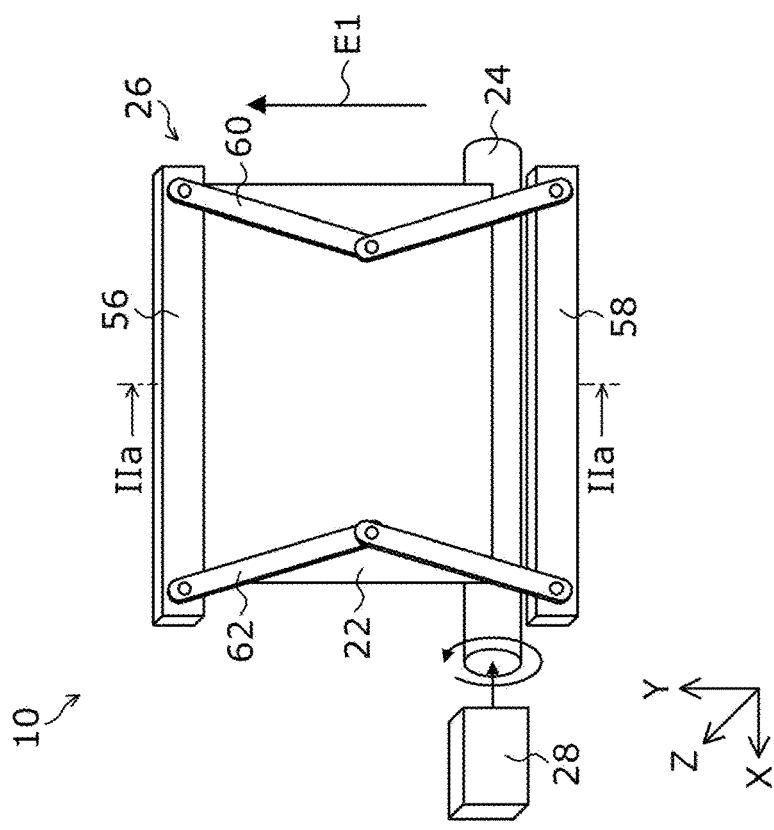

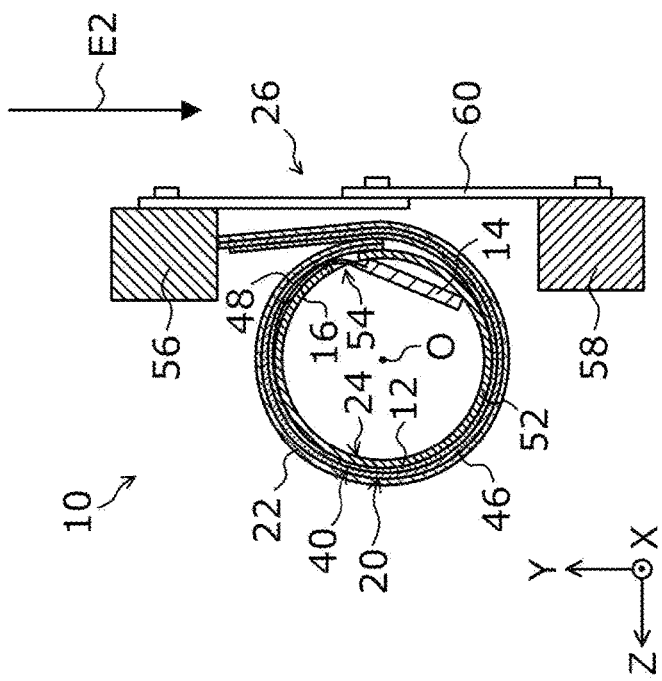
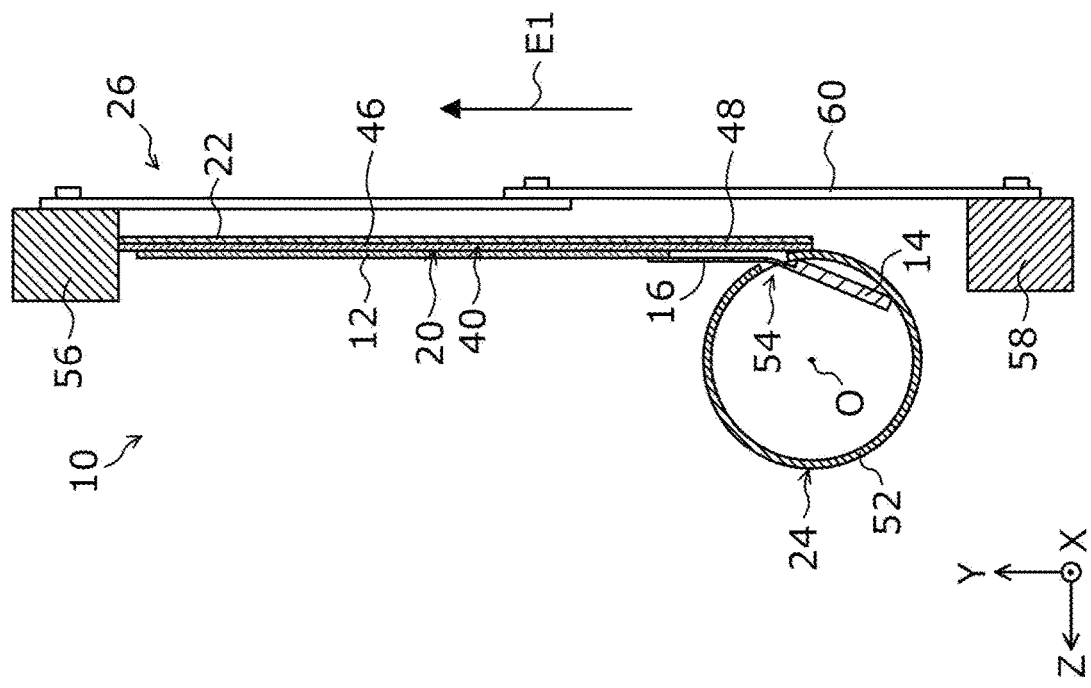

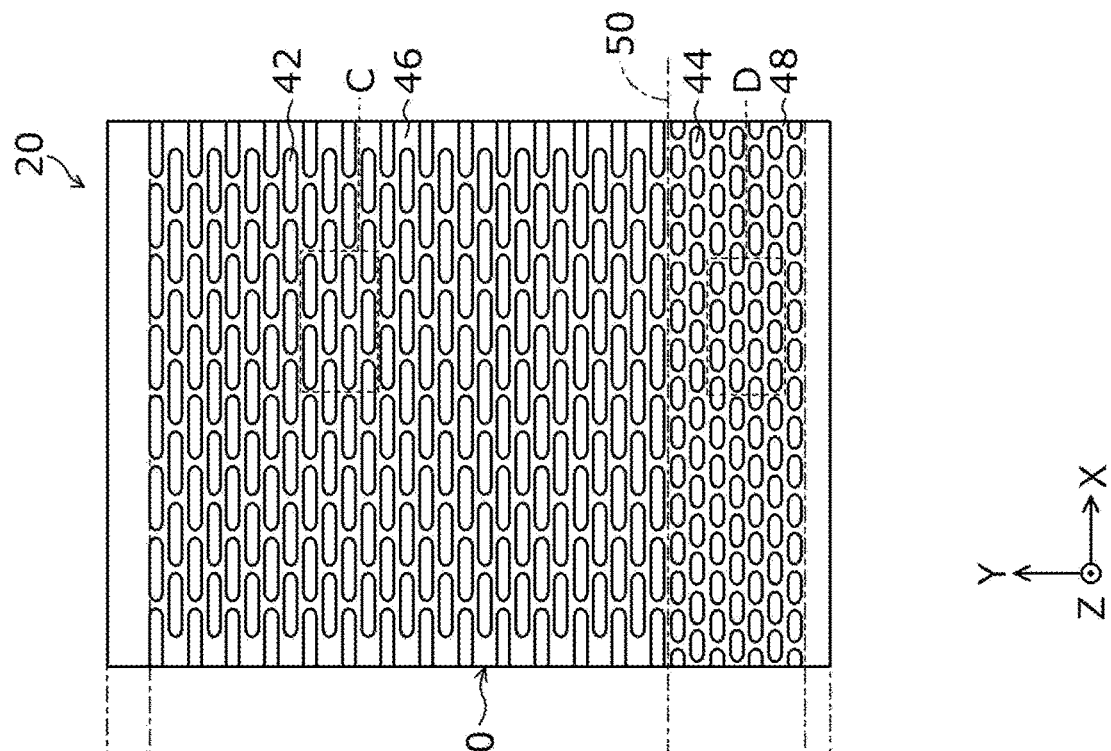
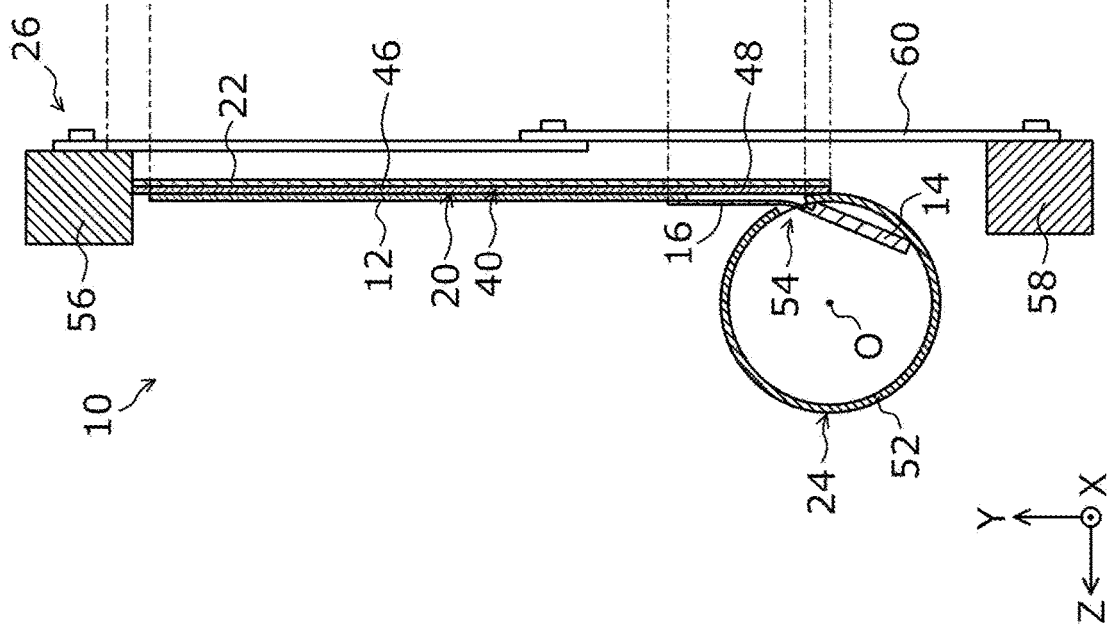

|  | LEVEL 1<br>L/S=1/0.1 | LEVEL 2<br>L/S=2/0.1 | LEVEL 3<br>L/S=3/0.1 | LEVEL 4<br>L/S=4/0.1 |
|---|---|---|---|---|
| LOAD | ELONGATION RATE | | | |
| 0[g] | 0.0[%] | 0.0[%] | 0.0[%] | 0.0[%] |
| 200[g] | 0.0[%] | 0.2[%] | 0.9[%] | 2.7[%] |
| 600[g] | 0.0[%] | 0.7[%] | 2.7[%] | 8.0[%] |
| 1000[g] | 0.0[%] | 1.1[%] | 4.4[%] | 13.3[%] |

F I G. 8

|  | URETHANE FOAM | SILICONE FOAM | URETHANE FILM SUPPORT | NYLON 66 | KEVLAR |
|---|---|---|---|---|---|
| THICKNESS [μm] | 500 | 700 | 500 | 300 | 500 |
| TENSILE STRENGTH [MPa] | 0.74 | 0.32 | 224(TD) 188(MD) | 244(TD) 236(MD) | 3400 |
| TENSILE ELONGATION [%] | 350 | 70 | 100(TD) 134(MD) | 30(TD) 27(MD) | 3.3 |
| HEAT RESISTANCE | 80[°C] | 180[°C] | 80[°C] | 150[°C] | 250[°C] |

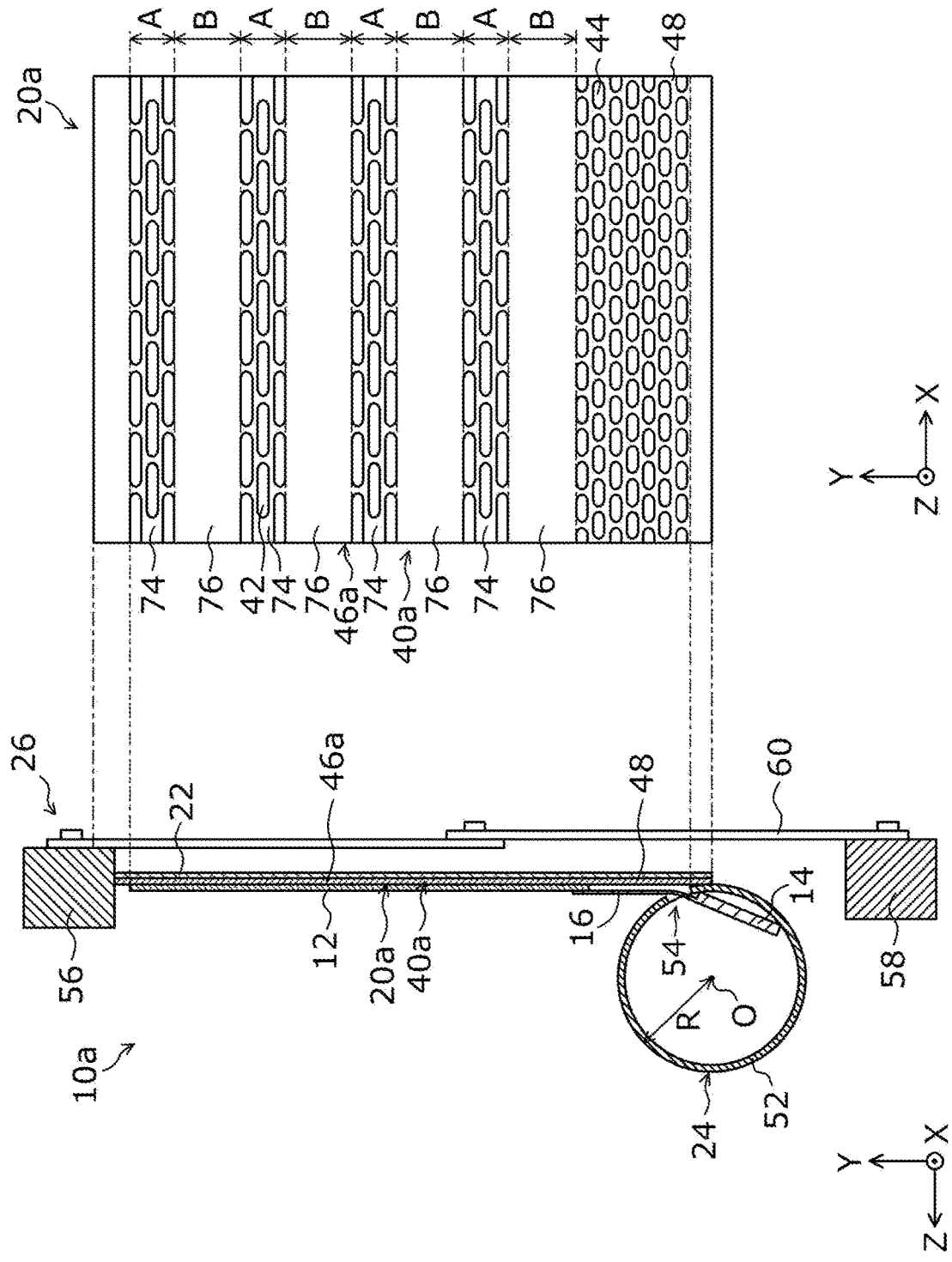

|  | LEVEL 1<br>A/B=1.4/5 | LEVEL 2<br>A/B=1.4/2 | LEVEL 3<br>A/B=0.8/2 | LEVEL 4<br>A/B=0.8/1 |
|---|---|---|---|---|
| LOAD | ELONGATION RATE | | | |
| 0[g] | 0.0[%] | 0.0[%] | 0.0[%] | 0.0[%] |
| 200[g] | 0.4[%] | 2.7[%] | 1.8[%] | 1.6[%] |
| 600[g] | 1.3[%] | 5.3[%] | 4.0[%] | 4.0[%] |
| 1000[g] | 2.2[%] | 7.5[%] | 5.3[%] | 6.0[%] |

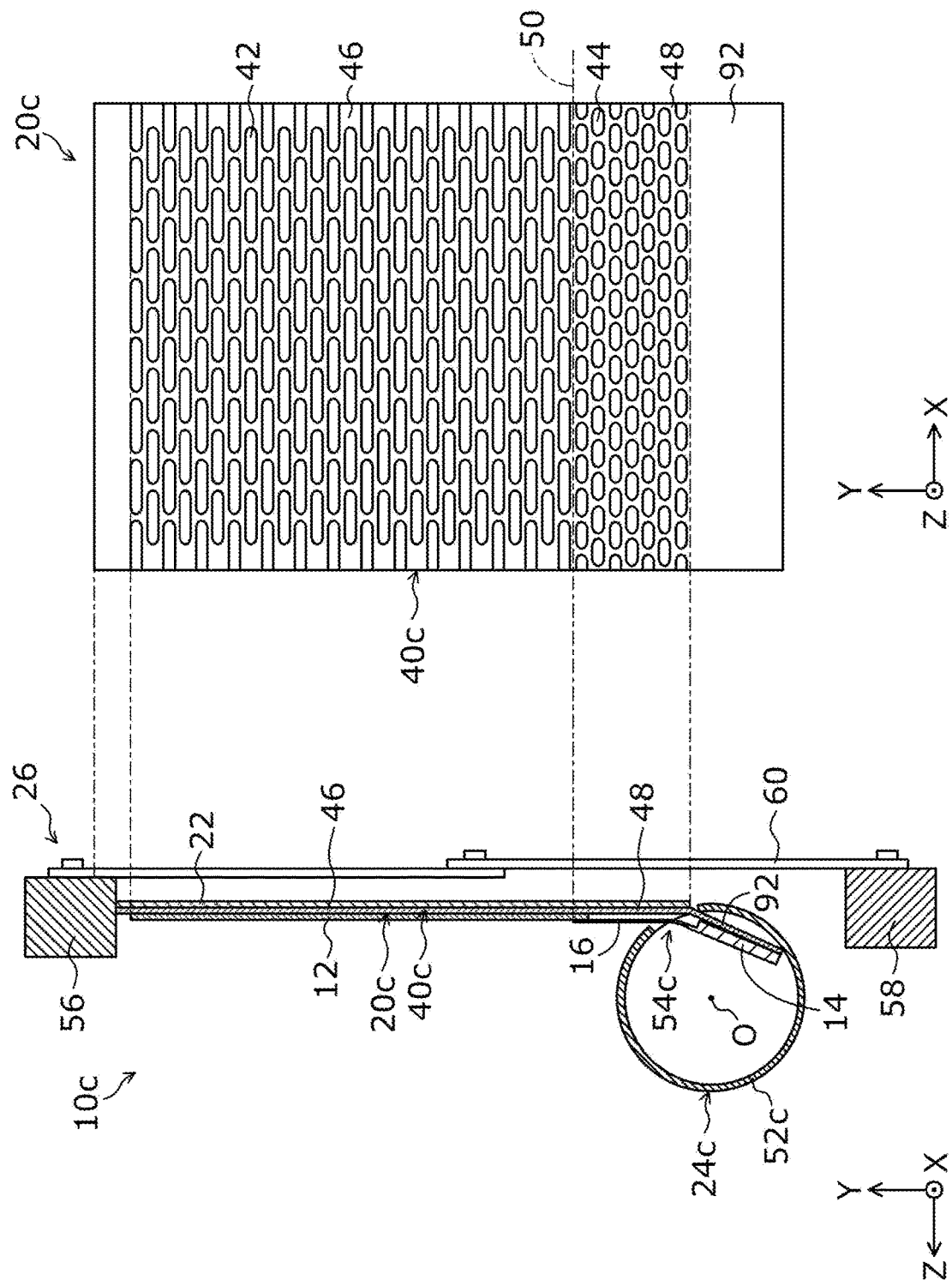

DISPLAY APPARATUS

CROSS REFERENCE TO RELATED APPLICATIONS

This application is claims priority benefit of Japanese Patent Application No. JP 2021-002600 filed in the Japan Patent Office on Jan. 12, 2021. The above-referenced application is hereby incorporated by reference in its entirety.

BACKGROUND

The present disclosure relates to a display apparatus, and particularly, to a display apparatus including a display panel that has flexibility.

In related art, a display apparatus including a display panel that has flexibility is known. Examples of this type of display apparatus include a display apparatus disclosed in Japanese Patent No. 6698920. The display apparatus includes a display panel that has flexibility, a circuit board that drives the display panel, a flexible film that connects the display panel and the circuit board, a back cover layered on the display panel, and a core to which the circuit board and the back cover are fixed, the core being configured to roll up the display panel and other parts.

SUMMARY

If the elasticity of a part of the back cover overlapping the flexible film is similar to the elasticity of a part overlapping the display panel, the display panel and other parts can easily be rolled up. However, there is a problem that the quality is reduced by a contact failure or other failure caused by the pull of the flexible film when the display panel and other parts are rolled up. There is also a problem that it becomes difficult to roll up the display panel and other parts if the part of the back cover overlapping the flexible film is prevented from being curved.

The present disclosure has been made in view of the problems above, and it is desirable to provide a display apparatus that can suppress a reduction in quality while preventing a display panel from becoming difficult to roll up.

According to an embodiment of the present disclosure, there is provided a display apparatus including a display panel that has flexibility, a drive board that drives the display panel, a flexible board that connects the display panel and the drive board and that has flexibility, a core to which the drive board is fixed, the core being configured to roll up the display panel and the flexible board, and a connection member including a plate-shaped member layered on the display panel, the plate-shaped member connecting the display panel and the core, the plate-shaped member being rolled up around the core along with the display panel and the flexible board. The plate-shaped member includes a first part overlapping the display panel and curved in a state in which the display panel is rolled up around the core and a second part overlapping the flexible board and curved in a state in which the flexible board is rolled up around the core. In a roll-up direction of the plate-shaped member, an elongation rate of the second part is smaller than an elongation rate of the first part.

According to the embodiment of the present disclosure, the display apparatus that can suppress reduction in quality while preventing the display panel from becoming difficult to roll up can be provided.

BRIEF DESCRIPTION OF THE DRAWINGS

FIGS. 1A and 1B are perspective views illustrating a display apparatus according to a first embodiment in different states;

FIGS. 2A and 2B are cross-sectional views illustrating the display apparatus in the respective states illustrated in FIGS. 1A and 1B;

FIGS. 4A and 4B depict a cross section of the display apparatus of FIG. 1A and a connection member;

FIG. 8 depicts examples of a material of a protection member;

FIGS. 9A and 9B depict a cross section of a display apparatus and a connection member according to a second embodiment;

FIGS. 13A and 13B depict a cross section of a display apparatus and a connection member according to a fourth embodiment.

DETAILED DESCRIPTION OF THE PREFERRED EMBODIMENTS

Figure 3:
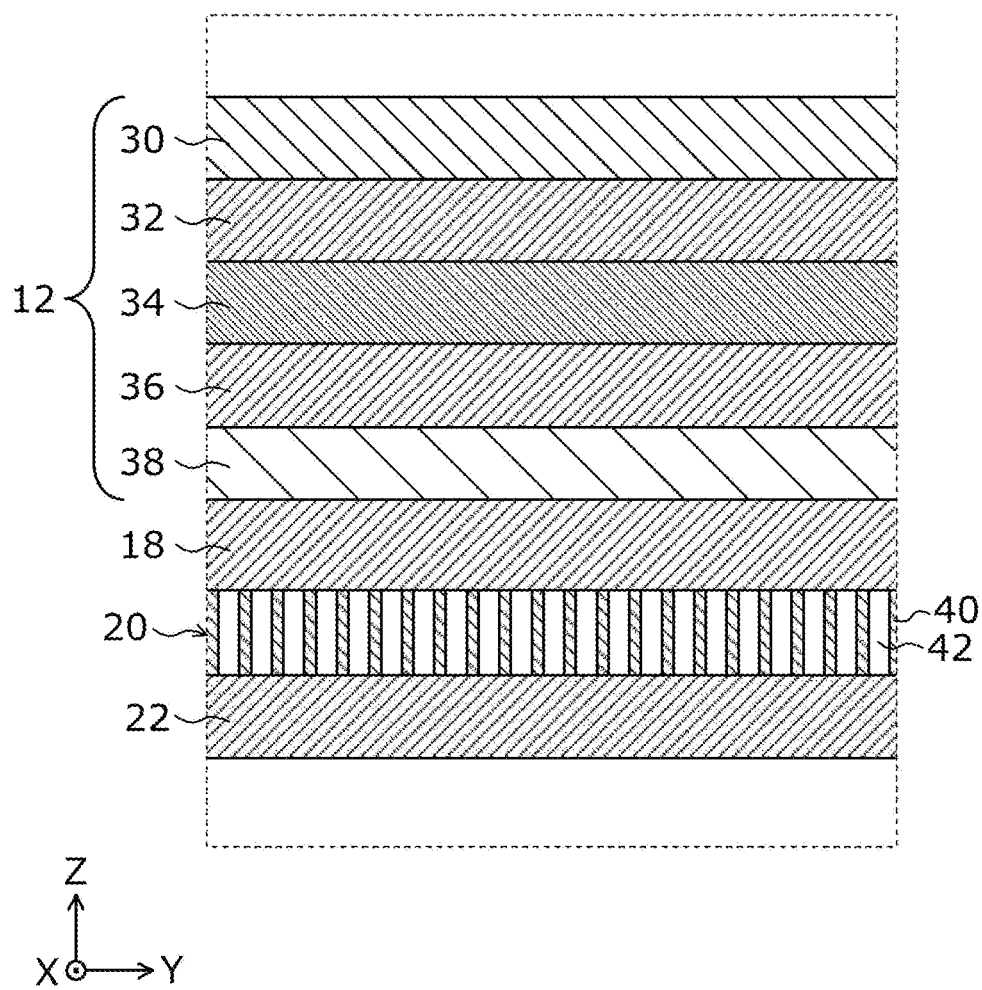
FIG. 3 is a cross-sectional view illustrating part of a display panel and other parts of the display apparatus of FIGS. 1A and 1B.

Embodiments of a display apparatus according to the present disclosure will now be described with reference to the drawings. Note that each of the embodiments described below illustrates a specific example of the present disclosure. Therefore, values, constituent elements, and arrangement positions and the connection modes of the constituent elements described in the following embodiments are examples and are not intended to limit the present disclosure. Thus, the constituent elements not described in the independent claim among the constituent elements in the following embodiments are described as optional constituent elements.

In the drawings, substantially the same constituent elements are provided with the same symbols. The drawings are schematic diagrams and may not represent exact ratios of sizes of the components.

In the following description, a first direction is a direction indicated by an X-axis in FIGS. 1A to 6B, 9A to 10B, and 12 to 13B. A second direction is a direction indicated by a Y-axis in FIGS. 1A to 6B, 9A to 10B, and 12 to 13B. A third direction is a direction indicated by a Z-axis in FIGS. 1A to 6B, 9A to 10B, and 12 to 13B. The first direction, the second direction, and the third direction are directions orthogonal to each other.

First Embodiment

A display apparatus 10 according to a first embodiment will be described with reference to FIGS. 1A to 8.

Figure 5A:
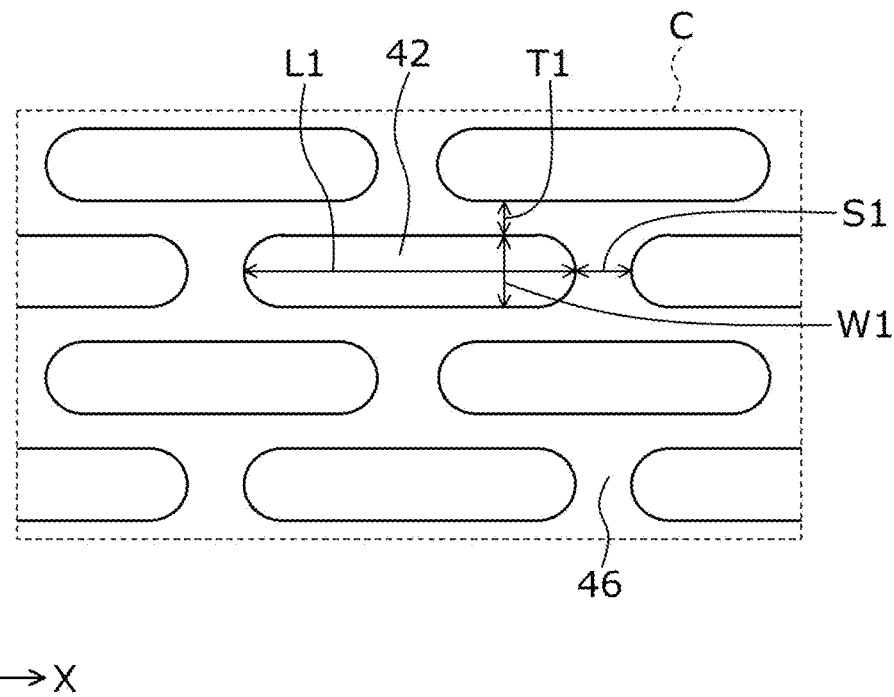
FIGS. 5A and 5B depict a part surrounded by a dashed line C and a part surrounded by a dashed line D in FIG. 4B.
Figure 5B:
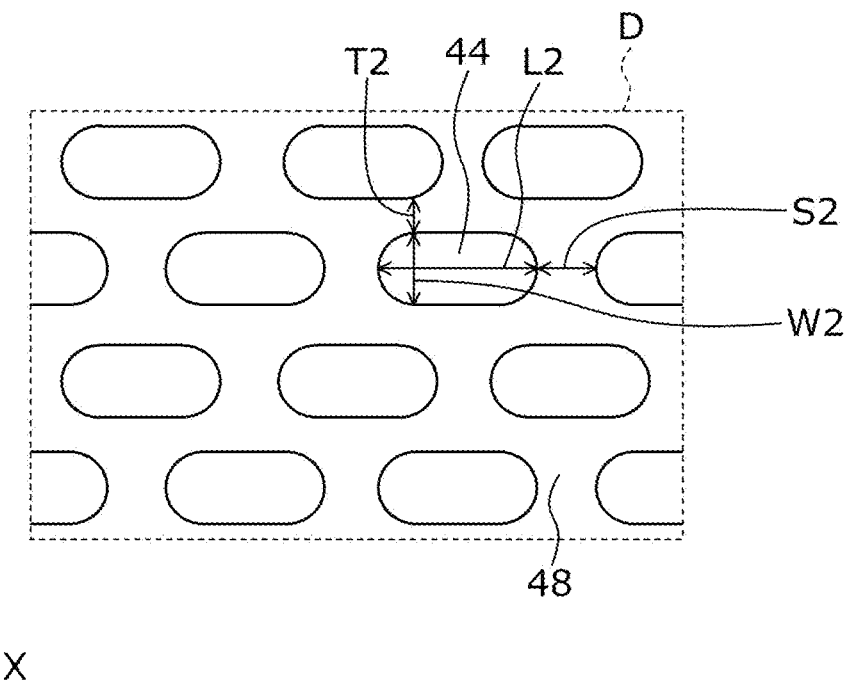

FIGS. 1A and 1B are perspective views illustrating the display apparatus 10 according to the first embodiment in different states. FIG. 1A illustrates a state in which a display panel 12 and other parts are drawn out, and FIG. 1B illustrates a state in which the display panel 12 and other parts are rolled up. FIGS. 2A and 2B are cross-sectional views illustrating the display apparatus 10 in the respective states illustrated in FIGS. 1A and 1B. FIG. 2A illustrates a cross section along a line IIa-IIa in FIG. 1A, and FIG. 2B illustrates a cross section along a line IIb-IIb in FIG. 1B. FIG. 3 is a cross-sectional view illustrating part of the display panel 12 and other parts of the display apparatus 10 of FIGS. 1A and 1B. FIGS. 4A and 4B depict a cross section of the display apparatus 10 of FIG. 1A and a connection member 20. FIG. 4A illustrates the cross section of the display apparatus 10, and FIG. 4B illustrates the connection member 20. FIGS. 5A and 5B depict a part surrounded by a dashed line C and a part surrounded by a dashed line D in FIG. 4B. FIG. 5A illustrates the part surrounded by the dashed line C in FIG. 4B, and FIG. 5B illustrates the part surrounded by the dashed line D in FIG. 4B. Note that, in FIGS. 2A and 2B and FIG. 4A, a plurality of first through holes 42, a plurality of second through holes 44, and other details are not illustrated in order to prevent complication of the drawings. This similarly applies to FIG. 9A, FIG. 12, and FIG. 13A.

As illustrated in FIGS. 1A to 5B, the display apparatus 10 is an apparatus that displays an image and other information, and the display apparatus 10 includes the display panel 12, a drive board 14, a flexible board 16, an optical adhesive sheet (optical clear adhesive or OCA) 18, the connection member 20, a protection member 22, a core 24, a pantograph unit 26, and a motor 28. The display apparatus 10 is a rollable display apparatus that can roll up the display panel 12, the flexible board 16, the optical adhesive sheet 18, the connection member 20, and the protection member 22 and that can draw out the rolled display panel 12 and other parts. The display apparatus 10 is used in, for example, a tablet terminal, a digital television, digital signage, a smartphone, or a wearable terminal.

The display panel 12 is a panel that displays an image, and has flexibility. The display panel 12 is what is generally called a flexible display. The display panel 12 has a rectangular shape with the first direction as a transverse direction and the second direction as a longitudinal direction and has a plate shape with the third direction as a thickness direction in the state in which the display panel 12 is drawn out from the core 24. The display panel 12 displays an image toward one side in the third direction (positive side in the Z-axis direction). The display panel 12 includes a cover window 30, an optical adhesive sheet 32, a circularly polarizing plate 34, an optical adhesive sheet 36, and an organic light emitting diode (OLED) panel 38. The cover window 30, the optical adhesive sheet 32, the circularly polarizing plate 34, the optical adhesive sheet 36, and the OLED panel 38 are layered in this order in the thickness direction of the display panel 12. The thickness direction of the display panel 12 coincides with the thickness direction of the optical adhesive sheet 18, the thickness direction of a plate-shaped member 40, and the thickness direction of the protection member 22. The cover window 30 is attached to the circularly polarizing plate 34 through the optical adhesive sheet 32, and the circularly polarizing plate 34 is attached to the OLED panel 38 through the optical adhesive sheet 36. The OLED panel 38 includes, for example, layers of a thin film transistor (TFT), an OLED including organic electro-luminescence (EL) elements, and thin film encapsulation (TFE).

The drive board 14 is a circuit board that drives the display panel 12 and is electrically connected to the display panel 12 through the flexible board 16. The drive board 14 includes a circuit that drives the display panel 12. The drive board 14 is provided in front of the display panel 12 in a roll-up direction and is fixed to a main body 52 of the core 24 inside the main body 52. The roll-up direction is a direction in which the display panel 12, the flexible board 16, the optical adhesive sheet 18, the connection member 20, and the protection member 22 move when the core 24 rolls up the display panel 12, the flexible board 16, the optical adhesive sheet 18, the connection member 20, and the protection member 22. The drive board 14 is, for example, a printed circuit board (PCB).

The flexible board 16 is a circuit board that electrically connects the display panel 12 and the drive board 14, and has flexibility. The flexible board 16 is connected to the display panel 12 and the drive board 14 and connects the display panel 12 and the drive board 14. That is, the flexible board 16 links the display panel 12 and the drive board 14 through the flexible board 16 to prevent the display panel 12 and the drive board 14 from being separated from each other. The flexible board 16 is connected to a front end of the OLED panel 38 in the roll-up direction and protrudes forward in the roll-up direction with respect to the OLED panel 38. The flexible board 16 includes a part not overlapping the display panel 12 as viewed from the third direction in the state in which the flexible board 16 is drawn out from the core 24. A front end of the flexible board 16 in the roll-up direction is connected to the drive board 14. Note that the flexible board 16 may not be directly connected to the display panel 12 and the drive board 14, and the flexible board 16 may be indirectly connected to the display panel 12 and the drive board 14 through, for example, another member. The flexible board 16 is, for example, a chip on film (COF).

The optical adhesive sheet 18 is pasted to a main surface of the display panel 12 on the connection member 20 side and is layered on the display panel 12. The optical adhesive sheet 18 is pasted to the entire main surface of the display panel 12. Examples of an adhesive that can be used for the optical adhesive sheet 18 include acrylic, silicone, epoxy, and rubber adhesives.

The connection member 20 includes the plate-shaped member 40, the plurality of first through holes 42, and the plurality of second through holes 44.

The plate-shaped member 40 is layered on the display panel 12 through the optical adhesive sheet 18 and attached to the display panel 12 through the optical adhesive sheet 18. The plate-shaped member 40 is attached to a back surface of the display panel 12. The plate-shaped member 40 protrudes forward with respect to the display panel 12 in the roll-up direction. A front end of the plate-shaped member 40 in the roll-up direction is fixed to a peripheral surface of the core 24, and the plate-shaped member 40 connects the display panel 12 and the core 24. That is, the plate-shaped member 40 links the display panel 12 and the core 24 through the plate-shaped member 40 to prevent the display panel 12 and the core 24 from being separated from each other. A back end of the plate-shaped member 40 in the roll-up direction is fixed to a first support member 56 of the pantograph unit 26. The plate-shaped member 40 has flexibility and is rolled up around the core 24 along with the display panel 12, the flexible board 16, the optical adhesive sheet 18, and the protection member 22. Rigidity of the plate-shaped member 40 is higher than rigidity of the display panel 12 and the flexible board 16, and the plate-shaped member 40 is a reinforcing member that maintains flatness of the display panel 12 in the state in which the display panel 12 is drawn out from the core 24. The plate-shaped member 40 has a rectangular shape with the first direction as the transverse direction and the second direction as the longitudinal direction and has a plate shape with the third direction as the thickness direction in the state in which the plate-shaped member 40 is drawn out from the core 24. Note that the shape of the plate-shaped member 40 is not limited to the rectangular shape with the first direction as the transverse direction and the second direction as the longitudinal direction in the state in which the plate-shaped member 40 is drawn out from the core 24. For example, the plate-shaped member 40 may have a rectangular shape with the first direction as the longitudinal direction and the second direction as the transverse direction. The plate-shaped member 40 may not have a rectangular shape, and for example, the plate-shaped member 40 may have a square shape, another polygonal shape, a circular shape, or an elliptical shape. The plate-shaped member 40 is formed from, for example, metal with a large elastic region, such as steel use stainless (SUS) 301. The plate-shaped member 40 includes a first part 46 and a second part 48.

The first part 46 overlaps the display panel 12 in the thickness direction of the plate-shaped member 40. The first part 46 is layered on the display panel 12 through the optical adhesive sheet 18 and attached to the display panel 12 through the optical adhesive sheet 18. The first part 46 has a rectangular shape with the first direction as the transverse direction and the second direction as the longitudinal direction as viewed from the third direction in the state in which the first part 46 is drawn out from the core 24, and the first part 46 overlaps the display panel 12. Note that the shape of the first part 46 is not limited to the rectangular shape with the first direction as the transverse direction and the second direction as the longitudinal direction in the state in which the first part 46 is drawn out from the core 24. The first part 46 may have, for example, a rectangular shape with the first direction as the longitudinal direction and the second direction as the transverse direction. The first part 46 is curved in the state in which the display panel 12 is rolled up around the core 24. That is, the plate-shaped member 40 is rolled up around the core 24 in the state in which the first part 46 is curved.

The second part 48 overlaps the flexible board 16 in the thickness direction of the plate-shaped member 40. The second part 48 is spaced apart from the flexible board 16. The second part 48 has a rectangular shape with the first direction as the longitudinal direction and the second direction as the transverse direction as viewed from the third direction in the state in which the second part 48 is drawn out from the core 24, and the second part 48 overlaps the flexible board 16. The second part 48 is curved in the state in which the flexible board 16 is rolled up around the core 24. That is, the plate-shaped member 40 is rolled up around the core 24 in the state in which the second part 48 is curved.

The second part 48 is positioned in front of the first part 46 in the roll-up direction and is adjacent to the first part 46. A boundary 50 between the first part 46 and the second part 48 extends in an orthogonal direction orthogonal to the thickness direction of the plate-shaped member 40 and orthogonal to the roll-up direction, and the boundary 50 overlaps the display panel 12 in the thickness direction of the plate-shaped member 40. The orthogonal direction is a direction coinciding with the first direction. Part of the second part 48, specifically, a back end of the second part 48 in the roll-up direction, overlaps the display panel 12 and is attached to the display panel 12 through the optical adhesive sheet 18. The boundary 50 is, for example, intermediate positions between the first through holes 42 and the second through holes 44 adjacent to each other in the roll-up direction.

An elongation rate of the second part 48 in the roll-up direction is smaller than an elongation rate of the first part 46. The elongation rate of the second part 48 in the roll-up direction is (elongated dimension of second part 48 in roll-up direction)/(dimension of second part 48 in roll-up direction), and the elongation rate of the first part 46 in the roll-up direction is (elongated dimension of first part 46 in roll-up direction)/(dimension of first part 46 in roll-up direction). The dimension of the second part 48 in the roll-up direction is, for example, a dimension from a front end of the second through holes 44 in a front row to a back end of the second through holes 44 in a last row in the roll-up direction. The dimension of the first part 46 in the roll-up direction is a dimension from a front end of the first through holes 42 in a front row to a back end of the first through holes 42 in a last row in the roll-up direction.

The plurality of first through holes 42 are provided in a staggered pattern in the first part 46. More specifically, the plurality of first through holes 42 include a plurality of first hole rows each including one or more first through holes 42 lined up in the orthogonal direction. The plurality of first hole rows are lined up in the roll-up direction, and the first through holes 42 in the first hole rows adjacent to each other in the roll-up direction among the plurality of first hole rows are adjacent to each other and shifted from each other in the orthogonal direction. The plurality of first through holes 42 are lined up at equal intervals in the orthogonal direction and are lined up at equal intervals in the roll-up direction. In the first embodiment, the plurality of first through holes 42 are provided in a staggered pattern from the front end to the back end of the first part 46 in the roll-up direction. Each of the plurality of first through holes 42 is a long hole going through the plate-shaped member 40 in the thickness direction of the plate-shaped member 40 and extending in the orthogonal direction, and each of the plurality of first through holes 42 has an oval shape. Note that each of the plurality of first through holes 42 may not have an oval shape and may have, for example, a rectangular shape. The plurality of first through holes 42 are formed by, for example, wet etching.

$L1>S1$ is satisfied where L1 represents a dimension of each of the plurality of first through holes 42 in the orthogonal direction and S1 represents a dimension between two first through holes 42 adjacent to each other in the orthogonal direction among the plurality of first through holes 42. S1 is a dimension of the part not provided with the first through holes 42, between two first through holes 42 adjacent to each other in the orthogonal direction among the plurality of first through holes 42. In the first embodiment, $L1/S1=3/0.1$ is satisfied.

$W1>T1$ is satisfied where W1 represents a dimension of each of the plurality of first through holes 42 in the roll-up direction and T1 represents a dimension between two first through holes 42 adjacent to each other in the roll-up direction among the plurality of first through holes 42. T1 is a dimension of the part not provided with the first through holes 42, between two first through holes 42 adjacent to each other in the roll-up direction among the plurality of first through holes 42.

The plurality of second through holes 44 are provided in a staggered pattern in the second part 48. More specifically, the plurality of second through holes 44 include a plurality of second hole rows each including one or more second through holes 44 lined up in the orthogonal direction. The plurality of second hole rows are lined up in the roll-up direction, and the second through holes 44 in the second hole rows adjacent to each other in the roll-up direction among the plurality of second hole rows are adjacent to each other and shifted from each other in the orthogonal direction. The plurality of second through holes 44 are lined up at equal intervals in the orthogonal direction and are lined up at equal intervals in the roll-up direction. In the first embodiment, the plurality of second through holes 44 are provided in a staggered pattern from the front end to the back end of the second part 48 in the roll-up direction. Each of the plurality of second through holes 44 is a long hole going through the plate-shaped member 40 in the thickness direction of the plate-shaped member 40 and extending in the orthogonal direction, and each of the plurality of second through holes 44 has an oval shape. Note that each of the plurality of second through holes 44 may not have an oval shape and may have, for example, a rectangular shape. The plurality of second through holes 44 are formed by, for example, wet etching.

L2>S2 is satisfied where L2 represents a dimension of each of the plurality of second through holes 44 in the orthogonal direction and S2 represents a dimension between two second through holes 44 adjacent to each other in the orthogonal direction among the plurality of second through holes 44. S2 is a dimension of the part not provided with the second through holes 44, between two second through holes 44 adjacent to each other in the orthogonal direction among the plurality of second through holes 44. In the first embodiment, L2/S2=1/0.1 is satisfied, and (L1/S1)>(L2/S2) is satisfied. In addition, L2<L1 is satisfied, and S2=S1 is satisfied.

W2>T2 is satisfied where W2 represents a dimension of each of the plurality of second through holes 44 in the roll-up direction and T2 represents a dimension between two second through holes 44 adjacent to each other in the roll-up direction among the plurality of second through holes 44. T2 is a dimension of the part not provided with the second through holes 44, between two second through holes 44 adjacent to each other in the roll-up direction among the plurality of second through holes 44. In the first embodiment, W1=W2 is satisfied, and T1=T2 is satisfied.

As described above, the plurality of first through holes 42 are provided in the first part 46, and the plurality of second through holes 44 are provided in the second part 48. As a result, the elongation rate of the second part 48 in the roll-up direction is smaller than the elongation rate of the first part 46. Note that the configuration of the plurality of first through holes 42 and second through holes 44 is not limited to the configuration described above, and it is only necessary that the elongation rate of the second part 48 in the roll-up direction be smaller than the elongation rate of the first part 46.

The first part 46 may be provided with, for example, a plurality of recessed portions in place of the plurality of first through holes 42, and the second part 48 may be provided with, for example, a plurality of recessed portions in place of the plurality of second through holes 44, to thereby make the elongation rate of the second part 48 in the roll-up direction smaller than the elongation rate of the first part 46. Instead of providing the plurality of first through holes 42 in the first part 46 and providing the plurality of second through holes 44 in the second part 48, different materials may be used for the first part 46 and the second part 48, to thereby make the elongation rate of the second part 48 in the roll-up direction smaller than the elongation rate of the first part 46.

The protection member 22 is a back surface cover that suppresses damage or other failure of a surface of the display panel 12 when the display panel 12 and other parts are rolled up, and the protection member 22 is layered on the connection member 20. The protection member 22 is adhesive and is attached to a main surface of the connection member 20 on an opposite side with respect to the display panel 12. The protection member 22 has a rectangular shape with the first direction as the transverse direction and the second direction as the longitudinal direction and has a plate shape with the third direction as the thickness direction as viewed from the third direction in the state in which the protection member 22 is drawn out from the core 24. The protection member 22 overlaps the display panel 12. The protection member 22 is formed from, for example, urethane or silicone. Note that the protection member 22 may not be adhesive and may be attached to the connection member 20 through an adhesive or other materials.

The core 24 is a roller to which the drive board 14 and the plate-shaped member 40 are fixed, the roller being configured to roll up the display panel 12, the flexible board 16, the optical adhesive sheet 18, the connection member 20, and the protection member 22. Specifically, the core 24 is a member around which the display panel 12, the flexible board 16, the optical adhesive sheet 18, the connection member 20, and the protection member 22 are rolled up when they are to be rolled up. The core 24 includes the main body 52 and a through portion 54. The main body 52 has a substantially cylindrical shape with the first direction as its axial direction, and the front end of the plate-shaped member 40 in the roll-up direction is fixed to a peripheral surface of the main body 52. The through portion 54 goes through the main body 52 in a radial direction of the main body 52 and extends in the axial direction of the main body 52. The flexible board 16 is inserted into the through portion 54.

The pantograph unit 26 includes the first support member 56, a second support member 58, a first arm portion 60, and a second arm portion 62. The first support member 56 sandwiches the back end of the plate-shaped member 40 and a back end of the protection member 22 in the roll-up direction and is attached to the back end of the plate-shaped member 40 and the back end of the protection member 22 in the roll-up direction. The second support member 58 is fixed to a member (not illustrated) that supports the core 24 in such a manner that the core 24 can be rotated. The first arm portion 60 and the second arm portion 62 connect the first support member 56 and the second support member 58 and apply a force in directions in which the first support member 56 and the second support member 58 separate from each other.

The motor 28 rotates the core 24. As the motor 28 is rotated in one direction, the core 24 is rotated in one direction about an axial center O. The first support member 56 moves in a direction away from the second support member 58, and the display panel 12 and other parts are drawn out from the core 24 (see an arrow E1 in FIGS. 1A and 2A). As the motor 28 is rotated in the other direction, the core 24 is rotated in the other direction about the axial center O. The first support member 56 moves in a direction toward the second support member 58, and the display panel 12 and other parts are rolled up (see an arrow E2 in FIGS. 1B and 2B).

Figure 6A:
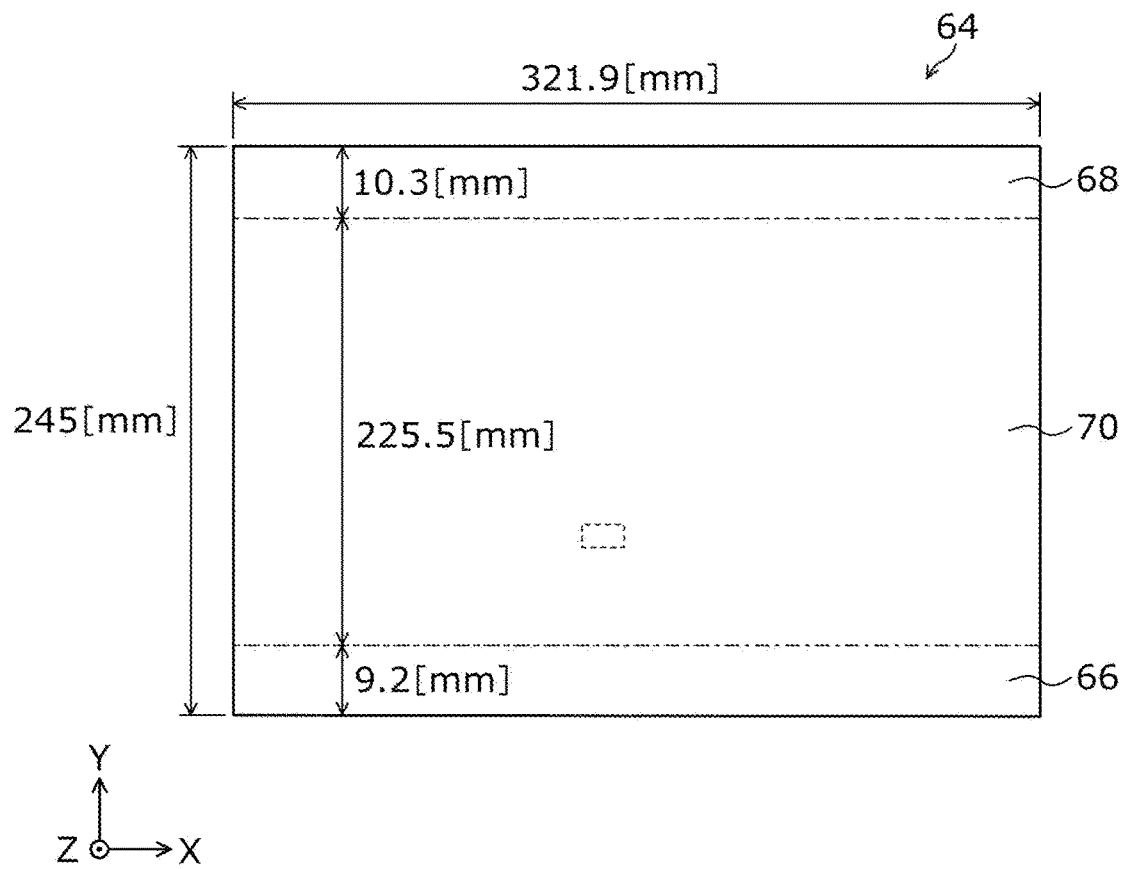
FIGS. 6A and 6B depict an example of a connection member used in an experiment for obtaining an elongation rate.
Figure 6B:
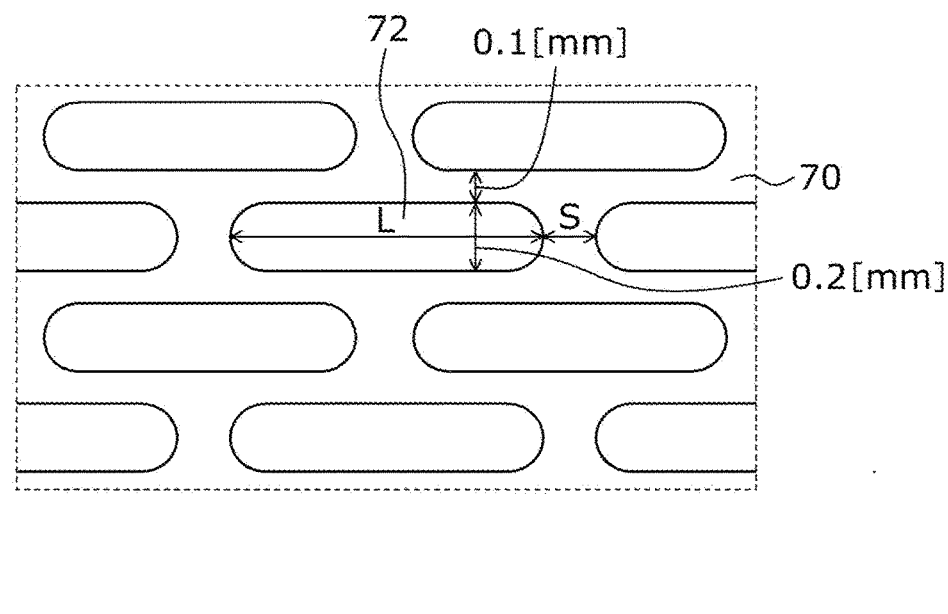
Figures 7A, 7B:
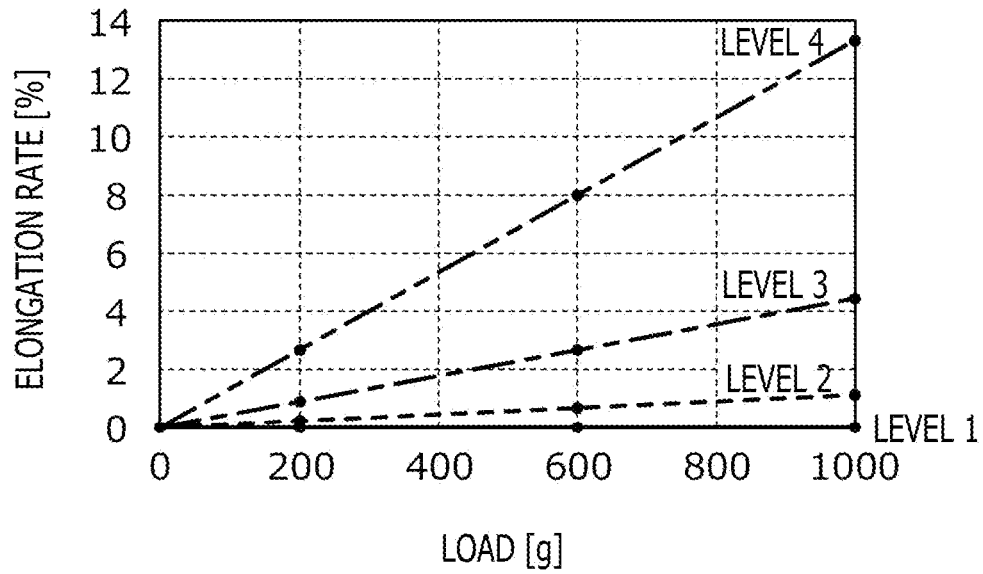
FIGS. 7A and 7B depict results of the experiment for obtaining the elongation rate, using the connection member of FIGS. 6A and 6B.

FIGS. 6A and 6B depict an example of a connection member 64 used in an experiment for obtaining the elongation rate. FIG. 6A illustrates the entire connection member 64, and FIG. 6B illustrates a part surrounded by a dashed line in FIG. 6A. FIGS. 7A and 7B depict results of the experiment for obtaining the elongation rate, using the connection member 64 of FIGS. 6A and 6B. Note that, in FIG. 6A, through holes 72 are not illustrated in order to prevent complication of the drawing.

As illustrated in FIGS. 6A and 6B, the connection member 64 has a dimension of 245 [mm] in the roll-up direction, a dimension of 321.9 [mm] in the orthogonal direction, and a dimension of 0.2 [mm] in the thickness direction of the connection member 64, and the connection member 64 is formed from SUS 301. Through holes are not formed in a part 66 with a length of 9.2 [mm] toward a back end from a front end of the connection member 64 in the roll-up direction. Through holes are not formed in a part 68 with a length of 10.3 [mm] toward the front end from the back end of the connection member 64 in the roll-up direction. A plurality of through holes 72 are provided in a staggered pattern in a part 70 between the part 66 and the part 68. A dimension of each of the plurality of through holes 72 in the roll-up direction is 0.2 [mm], and a dimension between two through holes 72 adjacent to each other in the roll-up direction among the plurality of through holes 72 is 0.1 [mm].

As illustrated in FIGS. 6A to 7B, in the case of L=1 [mm] and S=0.1 [mm], L representing a dimension of each of the plurality of through holes 72 in the orthogonal direction, S representing a dimension between two through holes 72 adjacent to each other in the orthogonal direction among the plurality of through holes 72, the elongation rate of the connection member 64 in the roll-up direction is 0 [%] when loads of 0 [g], 200 [g], 600 [g], and 1000 [g] are applied to the connection member 64 in the roll-up direction. That is, the connection member 64 is curved but is not elongated in the roll-up direction in this case.

In the case of L=2 [mm] and S=0.1 [mm], the elongation rate of the connection member 64 in the roll-up direction is 0 [%] when a load of 0 [g] is applied to the connection member 64 in the roll-up direction, and the elongation rate of the connection member 64 in the roll-up direction is 0.2 [%] when a load of 200 [g] is applied. In this case, the elongation rate of the connection member 64 in the roll-up direction is 0.7 [%] when a load of 600 [g] is applied to the connection member 64 in the roll-up direction, and the elongation rate of the connection member 64 in the roll-up direction is 1.1 [%] when a load of 1000 [g] is applied.

In the case of L=3 [mm] and S=0.1 [mm], the elongation rate of the connection member 64 in the roll-up direction is 0 [%] when a load of 0 [g] is applied to the connection member 64 in the roll-up direction, and the elongation rate of the connection member 64 in the roll-up direction is 0.9 [%] when a load of 200 [g] is applied. In this case, the elongation rate of the connection member 64 in the roll-up direction is 2.7 [%] when a load of 600 [g] is applied to the connection member 64 in the roll-up direction, and the elongation rate of the connection member 64 in the roll-up direction is 4.4 [%] when a load of 1000 [g] is applied.

In the case of L=4 [mm] and S=0.1 [mm], the elongation rate of the connection member 64 in the roll-up direction is 0 [%] when a load of 0 [g] is applied to the connection member 64 in the roll-up direction, and the elongation rate of the connection member 64 in the roll-up direction is 2.7 [%] when a load of 200 [g] is applied. In this case, the elongation rate of the connection member 64 in the roll-up direction is 8.0 [%] when a load of 600 [g] is applied to the connection member 64 in the roll-up direction, and the elongation rate of the connection member 64 in the roll-up direction is 13.3 [%] when a load of 1000 [g] is applied.

In this way, the larger the L with respect to S, that is, the larger the L/S, the larger the elongation rate in the roll-up direction, and the connection member 64 can easily be elongated in the roll-up direction. L1/S1=3/0.1 is satisfied, and L2/S2=1/0.1 is satisfied in the connection member 20 described above. Therefore, it can be recognized that the elongation rate of the second part 48 in the roll-up direction is smaller than the elongation rate of the first part 46.

FIG. 8 depicts examples of a material of the protection member 22.

As illustrated in FIG. 8, the protection member 22 with a thickness of 500 [μm] formed by using urethane foam has a tensile strength of 0.74 [MPa], a tensile elongation of 350 [%], and a heat resistance of 80 [° C.].

The protection member 22 with a thickness of 700 [μm] formed by using silicone foam has a tensile strength of 0.32 [MPa], a tensile elongation of 70 [%], and a heat resistance of 180 [° C.].

The protection member 22 with a thickness of 500 [μm] formed by using a urethane foam film support has a tensile strength of 224 [MPa] in a transverse direction (TD) and 188 [MPa] in a machine direction (MD), a tensile elongation of 100 [%] in TD and 134 [%] in MD, and a heat resistance of 80 [° C.].

The protection member 22 with a thickness of 300 [μm] formed by using nylon 66 has a tensile strength of 244 [MPa] in TD and 236 [MPa] in MD, a tensile elongation of 30 [%] in TD and 27 [%] in MD, and a heat resistance of 150 [° C.].

The protection member 22 with a thickness of 500 [μm] formed by using Kevlar has a tensile strength of 3400 [MPa], a tensile elongation of 3.3 [%], and a heat resistance of 250 [° C.].

The display apparatus 10 has been described.

The display apparatus 10 according to the first embodiment includes the display panel 12 that has flexibility, the drive board 14 that drives the display panel 12, the flexible board 16 that connects the display panel 12 and the drive board 14 and that has flexibility, the core 24 to which the drive board 14 is fixed, the core 24 being configured to roll up the display panel 12 and the flexible board 16, and the connection member 20 including the plate-shaped member 40 layered on the display panel 12, the plate-shaped member 40 connecting the display panel 12 and the core 24, the plate-shaped member 40 being rolled up around the core 24 along with the display panel 12 and the flexible board 16. The plate-shaped member 40 includes the first part 46 overlapping the display panel 12 and curved in the state in which the display panel 12 is rolled up around the core 24 and the second part 48 overlapping the flexible board 16 and curved in the state in which the flexible board 16 is rolled up around the core 24, and the elongation rate of the second part 48 in the roll-up direction of the plate-shaped member 40 is smaller than the elongation rate of the first part 46.

According to this configuration, in the plate-shaped member 40 connecting the display panel 12 and the core 24, the elongation rate of the second part 48 in the roll-up direction overlapping the flexible board 16 is smaller than the elongation rate in the roll-up direction of the first part 46 overlapping the display panel 12. Therefore, when the core 24 rolls up the display panel 12 and other parts, the first part 46 can easily be elongated to easily roll up the display panel 12, and the second part 48 can suppress the pull of the flexible board 16. This can suppress occurrence of a contact failure or other failures caused by the pull of the flexible board 16 and can suppress reduction in quality. As described, this can suppress the reduction in quality while preventing the display panel 12 from becoming difficult to roll up.

The second part 48 is attached to the display panel 12 in the display apparatus 10 according to the first embodiment.

According to this configuration, when the core 24 rolls up the display panel 12 and other parts, the second part 48 can suppress the pull of the display panel 12, and the pull of the flexible board 16 connected to the display panel 12 can be suppressed. This can further suppress the occurrence of a contact failure or other failures caused by the pull of the flexible board 16 and can further suppress the reduction in quality.

In the display apparatus 10 according to the first embodiment, the connection member 20 includes the plurality of first through holes 42 provided in a staggered pattern in the first part 46 and the plurality of second through holes 44 provided in a staggered pattern in the second part 48, and (L1/S1)>(L2/S2) is satisfied, where L1 represents the dimension of each of the plurality of first through holes 42 in the orthogonal direction orthogonal to the thickness direction of the plate-shaped member 40 and orthogonal to the roll-up direction, S1 represents the dimension between two first through holes 42 adjacent to each other in the orthogonal direction among the plurality of first through holes 42, L2 represents the dimension of each of the plurality of second through holes 44 in the orthogonal direction, and S2 represents the dimension between two second through holes 44 adjacent to each other in the orthogonal direction among the plurality of second through holes 44.

Therefore, the larger the L/S, the larger the elongation rate in the roll-up direction according to the experiment results described above. Thus, (L1/S1)>(L2/S2) can be satisfied to make the elongation rate of the second part 48 in the roll-up direction smaller than the elongation rate of the first part 46. This can suppress the occurrence of a contact failure or other failures caused by the pull of the flexible board 16 and can suppress the reduction in quality.

In the display apparatus 10 according to the first embodiment, (L1/S1)=(3/0.1) is satisfied, and (L2/S2)=(1/0.1) is satisfied.

Therefore, (L1/S1)=(3/0.1) can be satisfied to properly extend the first part 46 in the roll-up direction, and (L2/S2)=(1/0.1) can be satisfied to prevent the second part 48 from elongating in the roll-up direction according to the experiment results described above. This can further prevent the display panel 12 from becoming difficult to roll up and can further suppress the reduction in quality.

Second Embodiment

A display apparatus 10a according to a second embodiment will be described with reference to FIGS. 9A to 11B. The display apparatus 10a is mainly different from the display apparatus 10 in that a first part 46a includes a structure in which third parts 74 provided with the plurality of first through holes 42 in a staggered pattern and fourth parts 76 not provided with the plurality of first through holes 42 are alternately arranged in the roll-up direction. Differences from the display apparatus 10 will mainly be described.

FIGS. 9A and 9B depict a cross section of the display apparatus 10a and a connection member 20a according to the second embodiment. FIG. 9A illustrates the cross section of the display apparatus 10a, and FIG. 9B illustrates the connection member 20a.

As illustrated in FIGS. 9A and 9B, the display apparatus 10a is mainly different from the display apparatus 10 in that the display apparatus 10a includes the connection member 20a in place of the connection member 20, and the connection member 20a includes a plate-shaped member 40a in place of the plate-shaped member 40.

The plate-shaped member 40a includes the first part 46a and the second part 48. The first part 46a includes a plurality of third parts 74 provided with the plurality of first through holes 42 and includes a plurality of fourth parts 76 not provided with the plurality of first through holes 42. The third parts 74 and the fourth parts 76 are alternately arranged in the roll-up direction. The third parts 74 are each provided with the plurality of first through holes 42 in a staggered pattern.

A<B is satisfied where A represents a dimension of each third part 74 in the roll-up direction and B represents a dimension of each fourth part 76 in the roll-up direction. In the second embodiment, (A/B)=(0.8/1) is satisfied. The dimension of the third part 74 in the roll-up direction is, for example, a dimension from a front end of the first through holes 42 in a front row to a back end of the first through holes 42 in a last row in the roll-up direction among the plurality of first through holes 42 provided in the third part 74. The dimension of the fourth part 76 in the roll-up direction is, for example, a dimension from a back end of the first through holes 42 in a last row among the plurality of first through holes 42 provided in the third part 74 adjacent to and on the front side of the fourth part 76 to a front end of the first through holes 42 in a front row among the plurality of first through holes 42 provided in the third part 74 adjacent to and on the back side of the fourth part 76. Alternatively, the dimension of the fourth part 76 in the roll-up direction is, for example, a dimension from a back end of the second through holes 44 in a last row among the plurality of second through holes 44 provided in the second part 48 adjacent to and on the front side of the fourth part 76 to the front end of the first through holes 42 in the front row among the plurality of first through holes 42 provided in the third part 74 adjacent to and on the back side of the fourth part 76.

Note that, for example, A≥B may be satisfied instead of A<B. T1 (see FIG. 5A)<B may be satisfied, and W1 (see FIG. 5A)<B may be satisfied.

$(1-(A+B) \times n / 2 \times n \times R) \leq 0.2$ is satisfied where R represents a radius of the main body 52, n represents a pi, and n represents the number of sets per cycle in the state in which the plate-shaped member 40a is rolled up around the core 24, each set including one third part 74 and one fourth part 76 adjacent to the third part 74.

Figure 10A:
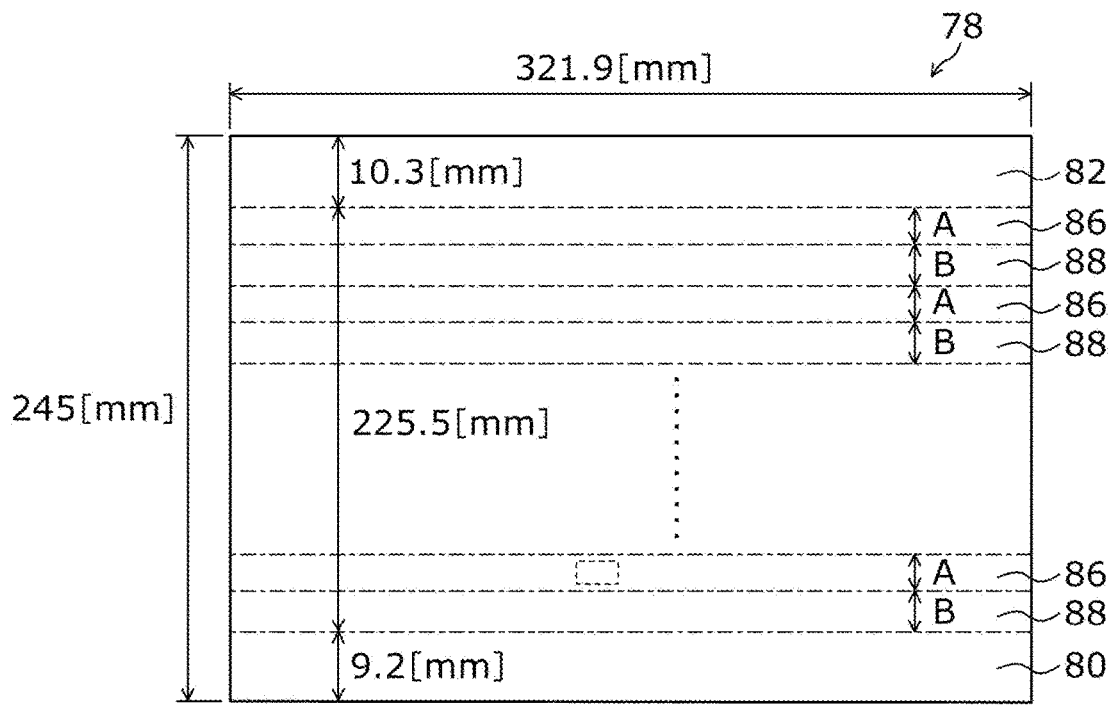
FIGS. 10A and 10B depict another example of the connection member used in an experiment for obtaining an elongation rate.
Figure 10B:
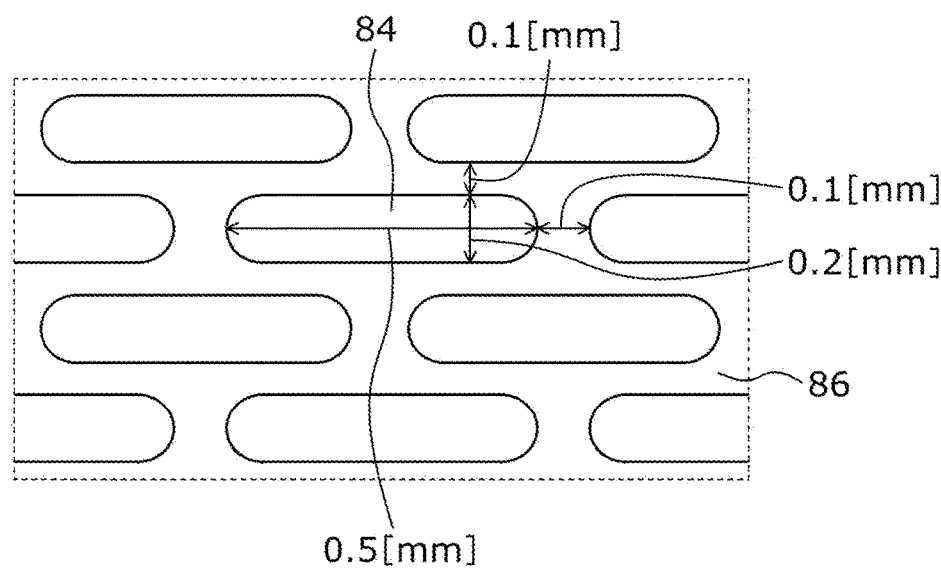
Figures 11A, 11B:
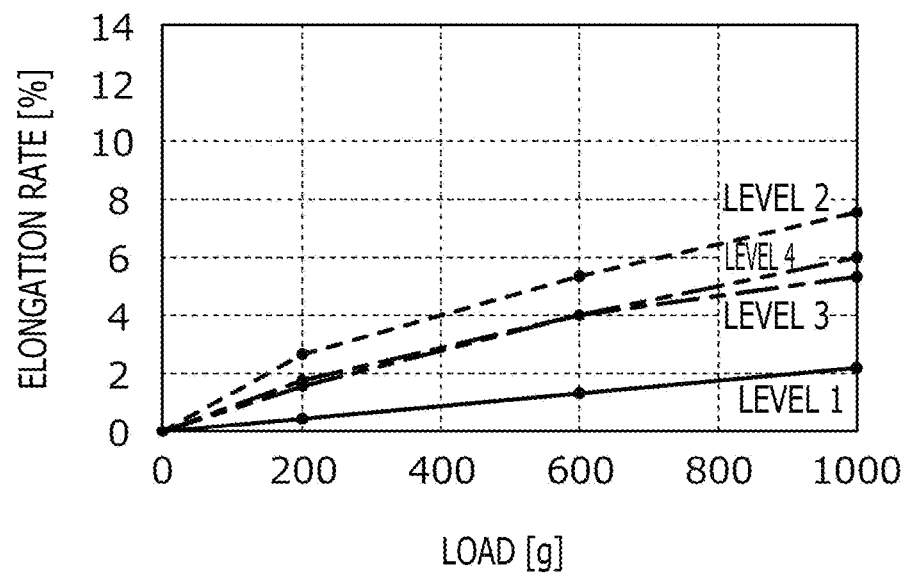
FIGS. 11A and 11B depict results of the experiment for obtaining the elongation rate, using the connection member of FIGS. 10A and 10B.

FIGS. 10A and 10B depict another example of the connection member, denoted by 78, used in an experiment for obtaining the elongation rate. FIGS. 11A and 11B depict results of the experiment for obtaining the elongation rate, using the connection member 78 of FIGS. 10A and 10B. Note that, in FIG. 10A, through holes 84 are not illustrated in order to prevent complication of the drawing.

As illustrated in FIGS. 10A and 10B, the connection member 78 has a dimension of 245 [mm] in the roll-up direction, a dimension of 321.9 [mm] in the orthogonal direction, and a dimension of 0.2 [mm] in the thickness direction of the connection member 78, and the connection member 78 is formed from SUS 301. Through holes are not formed in a part 80 with a length of 9.2 [mm] toward a back end from a front end of the connection member 78 in the roll-up direction. Through holes are not formed in a part 82 with a length of 10.3 [mm] toward the front end from the back end of the connection member 78 in the roll-up direction. Parts 86 provided with a plurality of through holes 84 in a staggered pattern and parts 88 not provided with through holes are alternately arranged between the part 80 and the part 82. A dimension of each of the plurality of through holes 84 in the orthogonal direction is 0.5 [mm], and a dimension between two through holes 84 adjacent to each other in the orthogonal direction among the plurality of through holes 84 is 0.1 [mm]. A dimension of each of the plurality of through holes 84 in the roll-up direction is 0.2 [mm], and a dimension between two through holes 84 adjacent to each other in the roll-up direction among the plurality of through holes 84 is 0.1 [mm].

As illustrated in FIGS. 10A to 11B, in the case of A=1.4 [mm] and B=5 [mm], the elongation rate of the connection member 78 in the roll-up direction is 0 [%] when a load of 0 [g] is applied to the connection member 78 in the roll-up direction, and the elongation rate of the connection member 78 in the roll-up direction is 0.4 [%] when a load of 200 [g] is applied. In this case, the elongation rate of the connection member 78 in the roll-up direction is 1.3 [%] when a load of 600 [g] is applied to the connection member 78 in the roll-up direction, and the elongation rate of the connection member 78 in the roll-up direction is 2.2 [%] when a load of 1000 [g] is applied.

In the case of A=1.4 [mm] and B=2 [mm], the elongation rate of the connection member 78 in the roll-up direction is 0 [%] when a load of 0 [g] is applied to the connection member 78 in the roll-up direction, and the elongation rate of the connection member 78 in the roll-up direction is 2.7 [%] when a load of 200 [g] is applied. In this case, the elongation rate of the connection member 78 in the roll-up direction is 5.3 [%] when a load of 600 [g] is applied to the connection member 78 in the roll-up direction, and the elongation rate of the connection member 78 in the roll-up direction is 7.5 [%] when a load of 1000 [g] is applied.

In the case of A=0.8 [mm] and B=2 [mm], the elongation rate of the connection member 78 in the roll-up direction is 0 [%] when a load of 0 [g] is applied to the connection member 78 in the roll-up direction, and the elongation rate of the connection member 78 in the roll-up direction is 1.8 [%] when a load of 200 [g] is applied. In this case, the elongation rate of the connection member 78 in the roll-up direction is 4.0 [%] when a load of 600 [g] is applied to the connection member 78 in the roll-up direction, and the elongation rate of the connection member 78 in the roll-up direction is 5.3 [%] when a load of 1000 [g] is applied.

In the case of A=0.8 [mm] and B=1 [mm], the elongation rate of the connection member 78 in the roll-up direction is 0 [%] when a load of 0 [g] is applied to the connection member 78 in the roll-up direction, and the elongation rate of the connection member 78 in the roll-up direction is 1.6 [%] when a load of 200 [g] is applied. In this case, the elongation rate of the connection member 78 in the roll-up direction is 4.0 [%] when a load of 600 [g] is applied to the connection member 78 in the roll-up direction, and the elongation rate of the connection member 78 in the roll-up direction is 6.0 [%] when a load of 1000 [g] is applied.

In the connection member 20*a* described above, (A/B)=(0.8/1) is satisfied, and therefore, the first part 46*a* can properly be extended in the roll-up direction. While the plate thickness of the plate-shaped member 40*a* for securing a required strength, workability of the plurality of first through holes 42, and other properties are limited, a high elongation rate and rigidity in a lateral direction (suppression of torsion) can be secured, so that periods of the third part 74 and the fourth part 76 are unlikely to be reflected as roughness on the surface of the display panel 12. A contact area between the connection member 20*a* and the display panel 12 can also be increased, so that the connection member 20*a* and the display panel 12 are unlikely to be peeled off.

The display apparatus 10*a* has been described.

In the display apparatus 10*a* according to the second embodiment, the first part 46*a* includes the plurality of third parts 74 provided with the plurality of first through holes 42 and includes the plurality of fourth parts 76 not provided with the plurality of first through holes 42. the third parts 74 and the fourth parts 76 are alternately arranged in the roll-up direction. A<B is satisfied where A represents the dimension of each third part 74 in the roll-up direction and B represents the dimension of each fourth part 76 in the roll-up direction.

According to this configuration, the fourth parts 76 can be provided to increase the contact area between the connection member 20*a* and the display panel 12, and an adhesive strength can be increased. This can prevent the connection member 20*a* from coming off from the display panel 12 and can suppress the reduction in quality.

In the display apparatus 10*a* according to the second embodiment, (A/B)=(0.8/1) is satisfied.

Therefore, (A/B)=(0.8/1) can be satisfied to properly extend the first part 46*a* in the roll-up direction according to the experiment results described above.

In the display apparatus 10*a* according to the second embodiment, $(1-(A+B) \times n/2 \times \pi \times R) \leq 0.2$ is satisfied where R represents the radius of the core 24, π represents the pi, and n represents the number of sets per cycle in the state in which the plate-shaped member 40*a* is rolled up around the core 24, each set including one third part 74 and one fourth part 76.

This can increase the contact area between the connection member 20*a* and the display panel 12 to increase the adhesive strength while preventing the display panel 12 from becoming difficult to roll up.

Third Embodiment

A display apparatus 10*b* according to a third embodiment will be described with reference to FIG. 12. The display apparatus 10*b* is mainly different from the display apparatus 10 in that a main body 52*b* of a core 24*b* includes a step portion 90. Differences from the display apparatus 10 will mainly be described.

Figure 12:
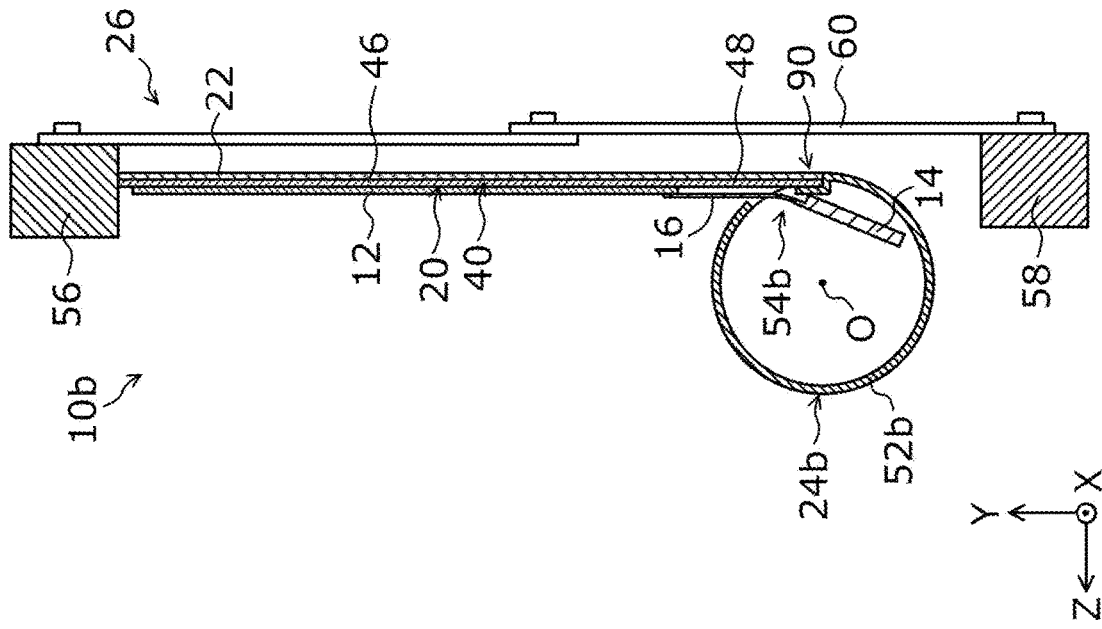
FIG. 12 is a cross-sectional view illustrating a display apparatus according to a third embodiment.

FIG. 12 is a cross-sectional view illustrating the display apparatus 10*b* according to the third embodiment.

As illustrated in FIG. 12, the display apparatus 10*b* is mainly different from the display apparatus 10 in that the display apparatus 10*b* includes the core 24*b* in place of the core 24.

The core 24*b* includes the main body 52*b* and a through portion 54*b*. The main body 52*b* has a substantially cylindrical shape with the first direction as its axial direction and includes the step portion 90 recessed inward on a peripheral surface of the main body 52*b*. A dimension (depth) of the step portion 90 in a radial direction of the main body 52*b* is a dimension equivalent to the sum of a dimension of the plate-shaped member 40 in the thickness direction and a dimension of the protection member 22 in the thickness direction.

The plate-shaped member 40 is fixed to the step portion 90. The plate-shaped member 40 and the protection member 22 are fixed to the step portion 90 such that they do not stick out from the step portion 90 in the radial direction of the main body 52*b*.

The display apparatus 10*b* has been described.

In the display apparatus 10b according to the third embodiment, the core 24b includes the step portion 90 recessed inward on the peripheral surface of the core 24b, and the plate-shaped member 40 is fixed to the step portion 90.

This can prevent the plate-shaped member 40 fixed to the core 24b from protruding outside the core 24b in the radial direction of the core 24b. Therefore, this can further prevent the display panel 12 from becoming difficult to roll up. Damage of the display panel 12 can be suppressed, and the reduction in quality can be suppressed.

Fourth Embodiment

A display apparatus 10c according to a fourth embodiment will be described with reference to FIGS. 13A and 13B. The display apparatus 10c is mainly different from the display apparatus 10 in that a connection member 20c is fixed to a main body 52c of a core 24c inside the main body 52c. Differences from the display apparatus 10 will mainly be described.

FIGS. 13A and 13B depict a cross section of the display apparatus 10c and the connection member 20c according to the fourth embodiment. FIG. 13A illustrates the cross section of the display apparatus 10c, and FIG. 13B illustrates the connection member 20c.

As illustrated in FIGS. 13A and 13B, the display apparatus 10c is mainly different from the display apparatus 10 in that the display apparatus 10c includes the connection member 20c in place of the connection member 20 and includes the core 24c in place of the core 24, and the connection member 20c includes a plate-shaped member 40c in place of the plate-shaped member 40.

The core 24c includes the main body 52c and a through portion 54c. The main body 52c has a substantially cylindrical shape with the first direction as its axial direction, and the through portion 54c goes through the main body 52c in a radial direction of the main body 52c and extends in the axial direction of the main body 52c.

The plate-shaped member 40c includes a fifth part 92 protruding toward the inside of the main body 52c from a front end of the second part 48 in the roll-up direction. The fifth part 92 and the flexible board 16 are inserted into the through portion 54c. The fifth part 92 and the drive board 14 are layered on top of each other and fixed to the main body 52c inside the main body 52c.

The display apparatus 10c has been described.

In the display apparatus 10c according to the fourth embodiment, the core 24c includes the cylindrical main body 52c and the through portion 54c going through the main body 52c in the radial direction of the main body 52c, the flexible board 16 and the plate-shaped member 40c are inserted into the through portion 54c, and the drive board 14 and the plate-shaped member 40c are layered on top of each other and fixed to the main body 52c inside the main body 52c.

Therefore, the plate-shaped member 40c does not have to be fixed to a peripheral surface of the main body 52c, and this can further prevent the display panel 12 from becoming difficult to roll up.

OTHER EMBODIMENTS, ETC.

While the display apparatus according to the present disclosure has been described based on the embodiments, the present disclosure is not limited to the embodiments. Modifications obtained by modifying the embodiments in various ways conceived by those skilled in the art without departing from the scope of the present disclosure and various devices incorporating the display panel according to the present disclosure are also included in the present disclosure.

The display apparatus according to the present disclosure can be used in a digital television, digital signage, a smartphone, a tablet terminal, a wearable terminal, and other devices.

What is claimed is:

1. A display apparatus comprising:
    a display panel that has flexibility;
    a drive board that drives the display panel;
    a flexible board that connects the display panel and the drive board and that has flexibility;
    a core to which the drive board is fixed, the core being configured to roll up the display panel and the flexible board; and
    a connection member including a plate-shaped member layered on the display panel, the plate-shaped member connecting the display panel and the core, the plate-shaped member being rolled up around the core along with the display panel and the flexible board, wherein
    the plate-shaped member includes a first part overlapping the display panel and curved in a state in which the display panel is rolled up around the core and a second part overlapping the flexible board and curved in a state in which the flexible board is rolled up around the core,
    in a roll-up direction of the plate-shaped member, an elongation rate of the second part is smaller than an elongation rate of the first part,
    the connection member includes a plurality of first through holes provided in a staggered pattern in the first part and a plurality of second through holes provided in a staggered pattern in the second part, and (L1/S1)>(L2/S2) is satisfied where L1 represents a dimension of each of the plurality of first through holes in an orthogonal direction orthogonal to a thickness direction of the plate-shaped member and orthogonal to the roll-up direction, S1 represents a dimension between two first through holes adjacent to each other in the orthogonal direction among the plurality of first through holes, L2 represents a dimension of each of the plurality of second through holes in the orthogonal direction, and S2 represents a dimension between two second through holes adjacent to each other in the orthogonal direction among the plurality of second through holes,
    the first part includes a plurality of third parts provided with the plurality of first through holes and a plurality of fourth parts not provided with the plurality of first through holes, the third parts and the fourth parts are alternately arranged in the roll-up direction, and
    A<B is satisfied where A represents a dimension of each of the third parts in the roll-up direction and B represents a dimension of each of the fourth parts in the roll-up direction.

2. The display apparatus according to claim 1, wherein the second part is attached to the display panel.

3. The display apparatus according to claim 1, wherein (L1/S1)=(3/0.1) is satisfied, and
(L2/S2)=(1/0.1) is satisfied.

4. The display apparatus according to claim 1, wherein (A/B)=(0.8/1) is satisfied.

5. The display apparatus according to claim 1, wherein $(1-(A+B)\times n/2\times n\times R)\leq 0.2$ is satisfied where R represents a radius of the core, n represents a pi, and n represents the number of sets per cycle in a state in which the plate-shaped member is rolled up around the core, each set including one of the plurality of third parts and one of the plurality of fourth parts.

6. The display apparatus according to claim 1, wherein the core includes a step portion recessed inward on a peripheral surface of the core, and the plate-shaped member is fixed to the step portion.

7. The display apparatus according to claim 1, wherein the core includes a cylindrical main body and a through portion going through the main body in a radial direction of the main body, the flexible board and the plate-shaped member are inserted into the through portion, and the drive board and the plate-shaped member are layered on top of each other and fixed to the main body inside the main body.

* * * * *